(12) United States Patent
Omine et al.

(10) Patent No.: US 10,256,394 B2
(45) Date of Patent: Apr. 9, 2019

(54) MAGNETORESISTIVE ELEMENT AND MAGNETIC MEMORY

(71) Applicant: KABUSHIKI KAISHA TOSHIBA, Minato-ku (JP)

(72) Inventors: Shumpei Omine, Meguro (JP); Tadaomi Daibou, Yokohama (JP); Yushi Kato, Chofu (JP); Naoki Hase, Shinagawa (JP); Junichi Ito, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/444,811

(22) Filed: Feb. 28, 2017

(65) Prior Publication Data
US 2017/0179374 A1    Jun. 22, 2017

Related U.S. Application Data

(63) Continuation of application No. PCT/JP2015/082198, filed on Nov. 17, 2015.

(30) Foreign Application Priority Data

Nov. 19, 2014 (JP) .................. 2014-234949

(51) Int. Cl.
*H01L 29/82* (2006.01)
*H01L 43/02* (2006.01)
(Continued)

(52) U.S. Cl.
CPC .............. *H01L 43/02* (2013.01); *H01F 10/16* (2013.01); *H01F 10/30* (2013.01); *H01F 10/32* (2013.01);
(Continued)

(58) Field of Classification Search
CPC ......... H01L 43/02; H01L 43/12; H01L 43/10; H01L 27/228; H01L 43/08
(Continued)

(56) References Cited

U.S. PATENT DOCUMENTS 5,693,426 A * 12/1997 Lee .................. G11B 5/66
 204/192.15
6,706,426 B1 * 3/2004 Yamamoto ............. B82Y 10/00
 360/46
(Continued)

FOREIGN PATENT DOCUMENTS

JP   2010-232499   10/2010
JP   2012-204683   10/2012
(Continued)

OTHER PUBLICATIONS

S. Mizukami, et al., "Long-Lived Ultrafast Spin Precession in Manganese Alloys Films with a Large Perpendicular Magnetic Anisotropy", Physical Review Letters, 2011, 4 pgs.
(Continued)

*Primary Examiner* — Vu A Vu
(74) *Attorney, Agent, or Firm* — Oblon, McClelland, Maier & Neustadt, L.L.P.

(57) ABSTRACT

A magnetoresistive element according to an embodiment includes: a first layer containing Al and at least one element of Ni or Co, the first layer having a CsCl structure; a first magnetic layer; a first nonmagnetic layer between the first layer and the first magnetic layer; and a second magnetic layer between the first layer and the first nonmagnetic layer, the second magnetic layer containing Mn and Ga.

16 Claims, 7 Drawing Sheets

(51) Int. Cl.
  *H01F 10/16* (2006.01)
  *H01F 10/30* (2006.01)
  *H01F 10/32* (2006.01)
  *H01L 43/08* (2006.01)
  *H01L 43/10* (2006.01)
  *H01L 27/105* (2006.01)
  *H01L 27/22* (2006.01)
  *H01L 43/12* (2006.01)

(52) U.S. Cl.
  CPC .......... *H01L 27/105* (2013.01); *H01L 27/228* (2013.01); *H01L 43/08* (2013.01); *H01L 43/10* (2013.01); *H01L 43/12* (2013.01)

(58) Field of Classification Search
  USPC ........................................................ 257/421
  See application file for complete search history.

(56) References Cited

U.S. PATENT DOCUMENTS

| | | | |
|---|---|---|---|
| 8,520,433 B1* | 8/2013 | Kato | .................. G11C 11/161 |
| | | | 365/148 |
| 8,680,632 B2* | 3/2014 | Daibou | ................... H01L 43/10 |
| | | | 257/421 |
| 8,680,633 B1 | 3/2014 | Kato et al. | |
| 8,895,162 B2 | 11/2014 | Nishiyama et al. | |
| 2006/0280972 A1* | 12/2006 | Gouke | .................... G11B 5/66 |
| | | | 428/829 |
| 2012/0241881 A1* | 9/2012 | Daibou | .................. H01L 43/10 |
| | | | 257/421 |
| 2013/0208578 A1 | 8/2013 | Kanbe et al. | |

FOREIGN PATENT DOCUMENTS

| | | |
|---|---|---|
| JP | 2012-221528 | 11/2012 |
| JP | 2013-168197 | 8/2013 |
| JP | 2013-197406 | 9/2013 |
| JP | 2014-63886 | 4/2014 |
| WO | WO 2011/027404 A1 | 3/2011 |

OTHER PUBLICATIONS

International Search Report dated Feb. 16, 2016 in PCT/JP2015/082198, filed on Nov. 17, 2015.

M. Tanaka, et al., "Epitaxial MnGa/NiGa magnetic multilayers on GaAs", Appl. Phys. Lett. vol. 63, (5), 1993, 3 pgs.

* cited by examiner

MAGNETORESISTIVE ELEMENT AND MAGNETIC MEMORY

CROSS REFERENCE TO RELATED APPLICATIONS

This application is a continuation of International Application No. PCT/JP2015/082198, filed on Nov. 17, 2015, which is based upon and claims the benefit of priority from the prior Japanese Patent Application No. 2014-234949, filed on Nov. 19, 2014, the entire contents of which are incorporated herein by reference.

FIELD

Embodiments of the present invention relate to magnetoresistive elements and magnetic memories.

BACKGROUND

A magnetic tunnel junction (MTJ) element as a magnetoresistive element has a basic structure that is a stack structure that includes a storage layer having a changeable magnetization direction, a reference layer having a fixed magnetization direction, and an insulating layer disposed between the storage layer and the reference layer. This MTJ element is known to have a tunneling magnetoresistive (TMR) effect, and is used as the storage element of a memory cell in a magnetoresistive random access memory (MRAM).

An MRAM stores information ("1" or "0") depending on changes in the relative angle between the magnetization directions of the magnetic layers in each MTJ element, and is nonvolatile. As the magnetization switching speed is several nanoseconds, high-speed data writing and high-speed data reading can be performed. In view of this, MRAMs are expected to be next-generation high-speed nonvolatile memories. Further, where a technique called spin transfer torque switching is used to control magnetization with a spin-polarized current, the cell size in an MRAM is reduced, and the current density increases accordingly. Thus, the magnetization of the storage layer can be readily reversed, and a high-density MRAM that consumes less power can be formed.

To increase the density of a nonvolatile memory, a higher degree of magnetoresistive element integration is essential. Also, to lower the write current while achieving a higher degree of integration, MRAMs using MTJ elements containing magnetic materials that have magnetizations perpendicular to the film surfaces have been developed in recent years.

Normally, an inversion current for reversing a magnetization by the spin transfer torque switching technique depends on the saturation magnetization and the magnetic relaxation constant of the storage layer. Therefore, there is a demand for a storage layer that has a lower saturation magnetization and a lower magnetic relaxation constant so that the magnetization of the storage layer can be reversed through low-current spin injection. Also, the influence of magnetic field leakage from the storage layer and the reference layer has become more and more conspicuous as magnetoresistive elements have become smaller in size. In view of this, there is a demand for thinner layers. In a case where the respective layers are made thinner, a ferromagnetic layer is greatly affected by the roughness of the interface with the base layer and diffusion of the elements contained in the base layer. Therefore, there is a demand for a material and a film formation method that can reduce the roughness of the interface and the diffusion of the elements.

DETAILED DESCRIPTION

A magnetoresistive element according to an embodiment includes: a first layer containing Al and at least one element of Ni or Co, the first layer having a CsCl structure; a first magnetic layer; a first nonmagnetic layer between the first layer and the first magnetic layer; and a second magnetic layer between the first layer and the first nonmagnetic layer, the second magnetic layer containing Mn and Ga.

The following is a description of magnetoresistive elements according to embodiments, with reference to the accompanying drawings.

(First Embodiment)

Figure 1:
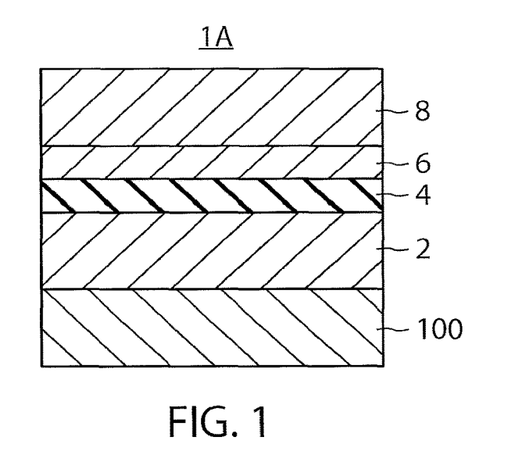
FIG. 1 is a cross-sectional view of a magnetoresistive element according to a first embodiment.

FIG. 1 shows a cross-section of a magnetoresistive element according to a first embodiment. The magnetoresistive element 1 of the first embodiment is an MTJ element, and has a structure in which a magnetic layer 2, a nonmagnetic layer 4 (hereinafter also referred to as the tunnel barrier layer 4), an interfacial magnetic layer 6, and a magnetic layer 8 are stacked in this order on a base layer 100. The base layer 100 is used to control the crystal properties such as the crystalline orientations and the crystal particle sizes of the magnetic layer 2 and the layers above the magnetic layer 2. This aspect will be described later in detail. The base layer 100 may be either a conductive layer or an insulating layer. In a case where current is applied to the base layer 100, it is preferable to use a conductive material.

The resistance value of the MTJ element 1 is determined by the angle between the magnetization directions of the two magnetic layers with the tunnel barrier layer interposed therebetween. The angle between the magnetization directions can be controlled with an external magnetic field or the current to be applied to the magnetoresistive element 1. A difference is generated between the coercive forces, the anisotropy fields Hk, or the Gilbert damping constants a of the two magnetic layers, so that the angle between the magnetization directions can be controlled in a more stable manner. The easy magnetization directions of the magnetic layer 2 and the magnetic layer 8 are perpendicular to the film surfaces. That is, the magnetic layer 2 and the magnetic layer 8 have magnetization directions perpendicular to the film surfaces (or include component perpendicular to the film surfaces). Here, the "film surfaces" means the upper surfaces of the respective layer. For example, "a direction perpendicular to the film surfaces" means the stacking direction in the stack structure including the magnetic layer 2 and the magnetic layer 8.

Where a write current is applied to the MTJ element 1, the magnetization direction of one of the magnetic layers 2 and 8 is invariable before and after the write, and the magnetization direction of the other one of the magnetic layers 2 and 8 is changeable with the write. The magnetic layer with the invariable magnetization direction is referred to as the reference layer, and the magnetic layer with the changeable magnetization direction is referred to as the storage layer. In this embodiment, the magnetic layer 2 is the storage layer, and the magnetic layer 8 is the reference layer, for example. The write current is applied between the magnetic layer 2 and the magnetic layer 8, to flow in a direction perpendicular to the film surfaces.

In a case where the magnetic layer 2 is the storage layer, the magnetic layer 8 is the reference layer, and the magnetization direction of the magnetic layer 2 and the magnetization direction of the magnetic layer 8 are antiparallel to each other (the opposite from each other), the write current is made to flow from the magnetic layer 2 toward the magnetic layer 8. In this case, electrons flow from the magnetic layer 8 to the magnetic layer 2 through the interfacial magnetic layer 6 and the nonmagnetic layer 4. Electrons that are spin-polarized by passing through the magnetic layer 8 flow into the magnetic layer 2. The spin-polarized electrons that have spins in the same direction as the magnetization of the magnetic layer 2 pass through the magnetic layer 2, but the spin-polarized electrons that have spins in the opposite direction from the magnetization of the magnetic layer 2 apply a spin torque to the magnetization of the magnetic layer 2 so that the magnetization direction of the magnetic layer 2 will switch to the same direction as the magnetization of the magnetic layer 8. As a result, the magnetization direction of the magnetic layer 2 is reversed, and becomes parallel to (the same as) the magnetization direction of the magnetic layer 8.

In a case where the magnetization direction of the magnetic layer 2 and the magnetization direction of the magnetic layer 8 are parallel to each other, on the other hand, the write current is made to flow from the magnetic layer 8 toward the magnetic layer 2. In this case, electrons flow from the magnetic layer 2 to the magnetic layer 8 through the nonmagnetic layer 4 and the interfacial magnetic layer 6. Electrons that are spin-polarized by passing through the magnetic layer 2 flow into the magnetic layer 8. The spin-polarized electrons that have spins in the same direction as the magnetization of the magnetic layer 8 pass through the magnetic layer 8, but the spin-polarized electrons that have spins in the opposite direction from the magnetization of the magnetic layer 8 are reflected by the interface between the interfacial magnetic layer 6 and the magnetic layer 8, and flow back into the magnetic layer 2 through the nonmagnetic layer 4. As a result, a spin torque is applied to the magnetization of the magnetic layer 2 so that the magnetization direction of the magnetic layer 2 will become the opposite from the magnetization direction of the magnetic layer 8. Consequently, the magnetization direction of the magnetic layer 2 is reversed, and becomes antiparallel to the magnetization direction of the magnetic layer 8. It should be noted that the interfacial magnetic layer 6 is provided to increase the spin polarizability.

The resistance value of the magnetoresistive element 1 depends on the relative angle between the magnetization directions of the magnetic layer 2 and the magnetic layer 8, and the value obtained by dividing the result of subtraction of the resistance value in a parallel state from the resistance value in an antiparallel state by the resistance value in the parallel state is called a magnetoresistive change rate.

Normally, a magnetic layer that is high in the coercive force, the anisotropy field Hk, or the Gilbert damping constant a is used as the reference layer, and a magnetic layer that is low in the coercive force, the anisotropy field Hk, or the Gilbert damping constant a is used as the storage layer. Since the surface roughness or conductivity of the base layer greatly affects the Gilbert damping constants a and the tunneling magnetoresistive effect (TMR effect), an appropriate base layer should be used.

In this embodiment and the respective embodiments described later, a $Mn_xGa_{100-x}$ (45 atm %≤x<64 atm %) alloy, for example, is used as the magnetic layer to serve as the storage layer, and this MnGa alloy has the c-axis as the axis of easy magnetization. Therefore, orientation control is performed so that the c-axis becomes perpendicular to the film surfaces at the time of crystallization, and thus, a magnetoresistive element of a perpendicular magnetization type can be formed.

MnGa can have a saturation magnetization amount that varies with its composition. Also, MnGa is a perpendicular magnetization material having a high magnetic anisotropy energy of approximately 10 (Merg/cc). Further, the value of a Gilbert damping constant, which is one of the indices of easiness of magnetization switching, depends on compositions, and has been reported to be approximately 0.008 to 0.015 (see S. Mizukami, F. Wu, A. Sakuma, 3. Walowski, D. Watanabe, T. Kubota, X. Zhang, H. Naganuma, M. Oogane, Y. Ando, and T. Miyazaki, "Long-Lived Ultrafast Spin Precession in Manganese Alloys Films with a Large Perpendicular Magnetic Anisotropy", Phys. Rev. Lett. 106, 117201 (2011), for example).

A Gilbert damping constant normally correlates with the size of the spin orbit interaction of the material. A material with a high atomic number tends to have a great spin orbit interaction and a high Gilbert damping constant. Being a material formed with light elements, MnGa has a low Gilbert damping constant. Since only a small energy is required in reversing magnetization, the current density for switching magnetization with spin-polarized electrons can be greatly lowered.

As described above, MnGa is a perpendicular magnetization material that has a low saturation magnetization, a high magnetic anisotropy energy, and a low Gilbert damping constant. In view of this, MnGa is suitable for the storage layer of a magnetoresistive element.

In the first embodiment, it is preferable to use an oxide insulator as the nonmagnetic layer 4. In a case where the MTJ element 1 has a stack structure formed by stacking a magnetic layer formed with MnGa, a nonmagnetic layer formed with crystalline MgO, and a magnetic layer formed with CoFe(B) in this order, for example, the orientation relationship, MnGa(001)/MgO(001)/CoFe(B)(001), can be established. Here, MnGa(001) and MgO(001) mean that crystals are orientated so that a (001) plane is exposed through each upper surface.

As the crystalline orientations are controlled, the easy magnetization directions of the magnetic layer 2 and the magnetic layer 8 can be made perpendicular to the film surfaces (or made to have perpendicular magnetic anisotropies). That is, the magnetoresistive element 1 of this embodiment becomes a so-called perpendicular magnetization MTJ element in which the respective magnetization directions of the magnetic layer 2 and the magnetic layer 8 are perpendicular to the film surfaces. It should be noted that, in this specification, a film surface means a surface perpendicular to the direction in which magnetic layers are stacked. An easy magnetization direction is such a direction that the internal energy becomes smallest when the spontaneous magnetization of a macro-sized ferromagnetic material is in the direction without any external magnetic field.

On the other hand, a hard magnetization direction is such a direction that the internal energy becomes largest when the spontaneous magnetization of a macro-sized ferromagnetic material is in the direction without any external magnetic field.

Next, the materials of the respective layers are described.

(Base Layer)

The base layer 100 is preferably formed with a material having a lattice constant close to that of the MnGa alloy that is used as the storage layer on the base layer and has an $L1_0$ phase. Such a material is not easily diffused. Also, it is preferable to use a material that has no phase to form a compound with Mn and Ga, or a material that causes tight coupling between elements in a binary system and does not diffuse itself. Such a base layer has a CsCl structure oriented in a (001) plane, and is formed with a combination of two or more elements among Ni, Mn, Rh, Ru, Ir, Co, Al, Ag, Zn, Pd, and Ga. Examples of such combinations include NiMn, NiGa, NiAl, CoAl, RhAl, RuAl, and AgGa. Alternatively, a ternary alloy, such as $MnNiAl_2$, $MnCoAl_2$, or $AlGaCo_2$, may be used. These materials for the base layer include compounds with Mn and Ga, and the crystal structure of each of these materials is of the CsCl type. In the case of RhAl, for example, RhMn and RhGa each form a CsCl structure. Even if these base materials mix with MnGa, each of these materials binds to Mn and Ga, and forms a crystal structure. Thus, diffusion is prevented.

Of the base layer materials that have the above characteristics, NiAl or CoAl is preferable, having little lattice mismatch with the MnGa to be stacked on the base layer. That is, a base layer material preferably contains Al and at least one of the elements Ni or Co. It is preferable to use $Ni_xAl_{100-x}$ (59 atm %>x≥45 atm %) as NiAl, and it is preferable to use $Co_xAl_{100-x}$ (56 atm %>x≥46 atm %) as CoAl.

Figure 2:
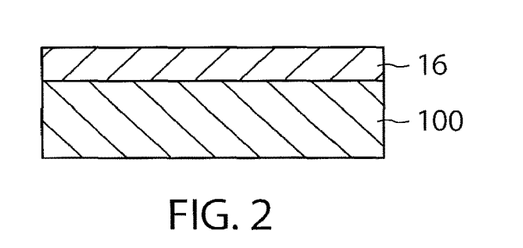
FIG. 2 is a diagram showing a sample in which a MnGa layer is formed on a NiAl layer.
Figure 3:
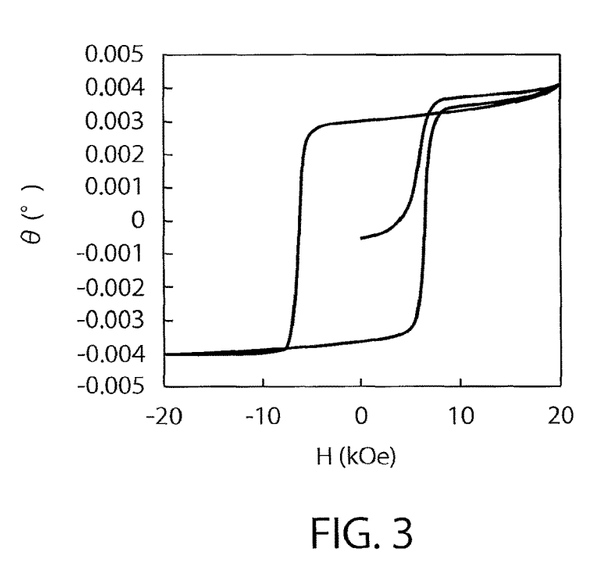
FIG. 3 is a graph showing the magnetization characteristics of the sample shown in FIG. 2.

A 40-nm thick NiAl layer is used as an example of the base layer 100 containing Al and at least one element of Ni or Co, and a 3-nm thick $Mn_{55}Ga_{45}$ layer 16 is formed on the NiAl layer 100. A sample created in this manner is prepared (see FIG. 2). FIG. 3 shows the results of measurement of the magnetization characteristics of this sample. The abscissa axis indicates the external magnetic field H, and the ordinate axis indicates the rotation angle θ. According to MOKE (Magneto Optical Kerr Effect) evaluation, perpendicular magnetic characteristics with a perpendicular coercive force of approximately 8 kOe and an excellent squareness ratio are obtained.

(Magnetic Layer 2)

The MnGa alloy used as the magnetic layer 2 has the c-axis as its axis of easy magnetization. Therefore, orientation control is performed so that the c-axis becomes perpendicular to the film surfaces at the time of crystallization, and thus, a perpendicular magnetization MTJ element can be formed. To perform magnetization switching with a low current, the thickness of the magnetic layer 2 needs to be made as small as possible. In view of this, the thickness is preferably within the range of 1 nm to 5 nm. However, in a crystalline material that can achieve a high thermal disturbance index A by virtue of a crystal magnetic anisotropy, there is a problem of a decrease in the anisotropy due to the reduction in thickness. In view of this, the thickness of the thin film is preferably not smaller than the critical thickness for crystallization but is preferably not greater than 10 nm.

(Interfacial Magnetic Layer 6)

To increase the magnetoresistance ratio of the magnetoresistive element, a material with a high spin polarizability is used for the interfacial magnetic layer adjacent to the MgO tunnel barrier layer 4. The interfacial magnetic layer 6 is preferably an alloy formed with at least one metal selected from the group consisting of Fe and Co. In a case where an interfacial magnetic layer formed with CoFe, a nonmagnetic layer formed with MgO, and another interfacial magnetic layer formed with CoFe are employed, for example, an epitaxial relationship expressed as CoFe(001)/MgO(001)/CoFe(001) can be established. In this case, the wavenumber selectivity for tunneling electrons can be improved, and thus, a high magnetoresistance ratio can be achieved.

(Nonmagnetic Layer 4)

The nonmagnetic layer 4 is made of an insulating material, and therefore, a tunnel barrier layer is used as the nonmagnetic layer 4. The material of the tunnel barrier layer is an oxide containing at least one element selected from the group consisting of magnesium (Mg), calcium (Ca), barium (Ba), aluminum (Al), beryllium (Be), strontium (Sr), zinc (Zn), or titanium (Ti). As used herein, a phrase referring to "at least one of" a list of items refers to any combination of those items, including a single member. As an example, "at least one of: a, b, or c" is intended to cover a, b, c, a-b, a-c, b-c, and a-b-c." Specific examples of such oxides include MgO, AlO, ZnO, SrO, and TiO. Alternatively, the tunnel barrier layer may be a mixed crystal material formed with two or more materials selected from the group consisting of the above oxides, or may be a stack structure formed with these materials. Examples of mixed crystal materials include MgAlO, MgZnO, MgTiO, and MgCaO. Examples of two-layer stack structures include MgO/ZnO, MgO/AlO, TiO/AlO, and MgAlO/MgO. Examples of three-layer stack structures include AlO/MgO/AlO and ZnO/MgO/ZnO. It should be noted that the left side of the symbol "/" indicates the upper layer, and the right side of the symbol "/" indicates the lower layer.

(Magnetic Layer 8)

Examples of materials that can be used for the magnetic layer 8 include alloys each containing at least one element selected from the group consisting of transition metals Fe, Co, or Ni, and at least one element selected from the group consisting of rare-earth metals Tb, Dy, or Gd. Examples of such alloys include TbFe, TbCo, TbFeCo, DyTbFeCo, or GdTbCo. Alternatively, a multi-layer structure in which these alloys are alternately stacked may be used. Specifically, examples of such multi-layer structures include multi-layer films such as TbFe/Co, TbCo/Fe, TbFeCo/CoFe, DyFe/Co, DyCo/Fe, or DyFeCo/CoFe. Each of these alloys can control the magnetic anisotropy energy density and the saturation magnetization by adjusting the thickness ratio and the composition.

The magnetic layer 8 has the axis of easy magnetization in a direction perpendicular to the film surface, or has a perpendicular magnetic anisotropy. Materials that can be used for the magnetic layer 8 are metals that are crystal-oriented in a (111) plane of a face-centered cubic (FCC) structure or in a (001) plane of a hexagonal close-packed (HCP) structure, or metals that can form artificial lattices, for example. Examples of metals that are crystal-oriented in a (111) plane of FCC or in a (001) plane of HCP include alloys each containing at least one element selected from the first group consisting of Fe, Co, Ni, or Cu, and at least one element selected from the second group consisting of Pt, Pd, Rh, or Au. Specifically, these examples include ferromagnetic alloys such as CoPd, CoPt, NiCo, or NiPt.

Examples of artificial lattices that can be used for the magnetic layer 8 include stack structures in which a single material formed with one element selected from the group consisting of Fe, Co, and Ni or an alloy (a magnetic film) containing the one element, and one element selected from the group consisting of Cr, Pt, Pd, Ir, Rh, Ru, Os, Re, Au, and Cu or an alloy (a nonmagnetic film) containing the one element are alternately stacked. Examples of such artificial lattices include a Co/Pt artificial lattice, a Co/Pd artificial lattice, a CoCr/Pt artificial lattice, a Co/Ru artificial lattice, Co/Os, Co/Au, and a Ni/Cu artificial lattice. Each of these artificial lattices can control the magnetic anisotropy energy density and the saturation magnetization by adjusting the addition of an element to the magnetic film and the thickness ratio between the magnetic film and the nonmagnetic film.

As described above, in this embodiment, the base layer has a CsCl structure oriented in a (001) plane and is formed with a material that is a combination of two or more elements among Ni, Mn, Rh, Ru, Ir, Co, Al, Ag, Zn, Pd, or Ga. This material is low in self-diffusion coefficient. Because of this, diffusion of the elements contained in the base layer can be reduced even if a MnGa layer that is a perpendicular magnetization material having a low saturation magnetization, a high magnetic anisotropy energy, and a low Gilbert damping constant is formed on the base layer.

(Modification)

Figure 4:
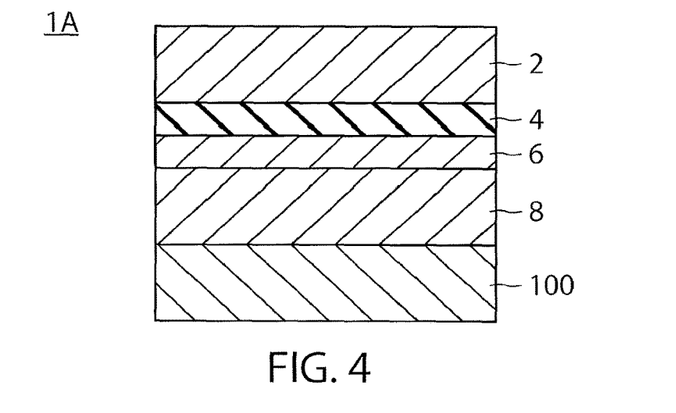
FIG. 4 is a cross-sectional view of a magnetoresistive element according to a modification of the first embodiment.

FIG. 4 shows a cross-section of a magnetoresistive element according to a modification of the first embodiment. In the magnetoresistive element 1A of this modification, the order of stacking the layers on the base layer 100 is the reverse of the order used in the magnetoresistive element 1 of the first embodiment shown in FIG. 1. That is, the magnetoresistive element 1A has a structure in which the magnetic layer 8, the interfacial magnetic layer 6, the nonmagnetic layer 4, and the magnetic layer 2 are stacked in this order on the base layer 100.

In this modification, where MnGa is used as the magnetic layer 8, the influence of diffusion of the elements contained in the base layer can be reduced even if the storage layer is made thinner, as in the first embodiment.

(Second Embodiment)

Figure 5:
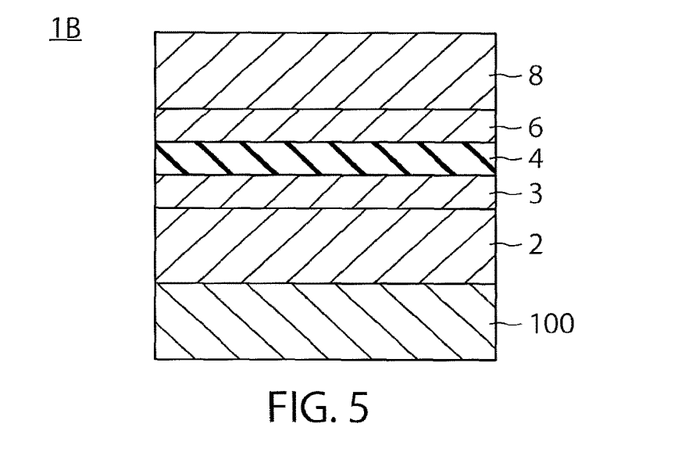
FIG. 5 is a cross-sectional view of a magnetoresistive element according to a second embodiment.

FIG. 5 shows a magnetoresistive element 1B according to a second embodiment. This magnetoresistive element 1B has the same structure as the magnetoresistive element 1 of the first embodiment shown in FIG. 1, except that an interfacial magnetic layer 3 is interposed between the nonmagnetic layer 4 and the magnetic layer 2. In the second embodiment, the magnetoresistive element 1B has a structure in which the magnetic layer 2, the interfacial magnetic layer 3, the nonmagnetic layer 4, the interfacial magnetic layer 6, and the magnetic layer 8 are stacked in this order on the base layer 100.

As in the case of the first embodiment, the crystalline orientations of the magnetic layers are controlled so that the magnetic layer 2 and the magnetic layer 8 each have a magnetic anisotropy perpendicular to the film surfaces (a perpendicular magnetic anisotropy). The easy magnetization directions of these magnetic layers can be perpendicular to the film surfaces. That is, the magnetoresistive element 1B of this embodiment becomes a so-called perpendicular magnetization MTJ element in which the respective magnetization directions of the magnetic layer 2 and the magnetic layer 8 are perpendicular to the film surfaces. Where a write current is applied to the MTJ element 1B, the magnetization direction of one of the magnetic layers 2 and 8 does not change before and after the write, and the magnetization direction of the other one of the magnetic layers 2 and 8 changes with the write. In this embodiment, the magnetic layer 2 is the storage layer, and the magnetic layer 8 is the reference layer, for example. The write current is applied between the magnetic layer 2 and the magnetic layer 8, to flow in a direction perpendicular to the film surfaces, as in the first embodiment.

It should be noted that the interfacial magnetic layer 3 is provided to increase the spin polarizability. The interfacial magnetic layer 3 is formed with the same material as that of the interfacial magnetic layer 6 described in the first embodiment.

In the second embodiment, the influence of diffusion of the elements contained in the base layer can be reduced even if the storage layer is made thinner, as in the first embodiment.

(Modification)

Figure 6:
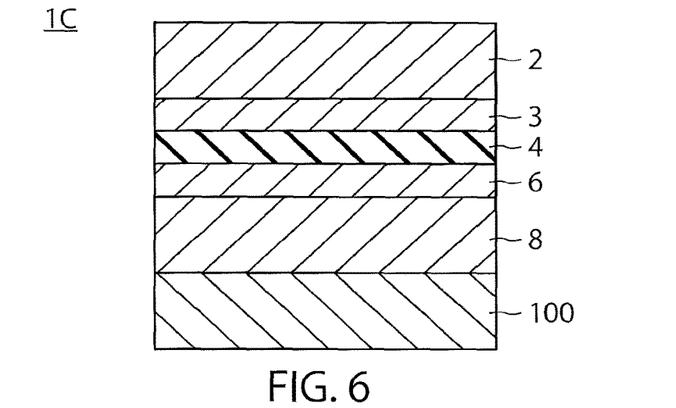
FIG. 6 is a cross-sectional view of a magnetoresistive element according to a modification of the second embodiment.

FIG. 6 shows a cross-section of a magnetoresistive element according to a modification of the second embodiment. In the magnetoresistive element 1C of this modification, the order of stacking the layers on the base layer 100 is the reverse of the order used in the magnetoresistive element 1B of the second embodiment shown in FIG. 5. That is, the magnetoresistive element 1C has a structure in which the magnetic layer 8, the interfacial magnetic layer 6, the nonmagnetic layer 4, the interfacial magnetic layer 3, and the magnetic layer 2 are stacked in this order on the base layer 100.

In this modification, where MnGa is used as the magnetic layer 8, the influence of diffusion of the elements contained in the base layer can be reduced even if the storage layer is made thinner, as in the second embodiment.

(Third Embodiment)

Figure 7:
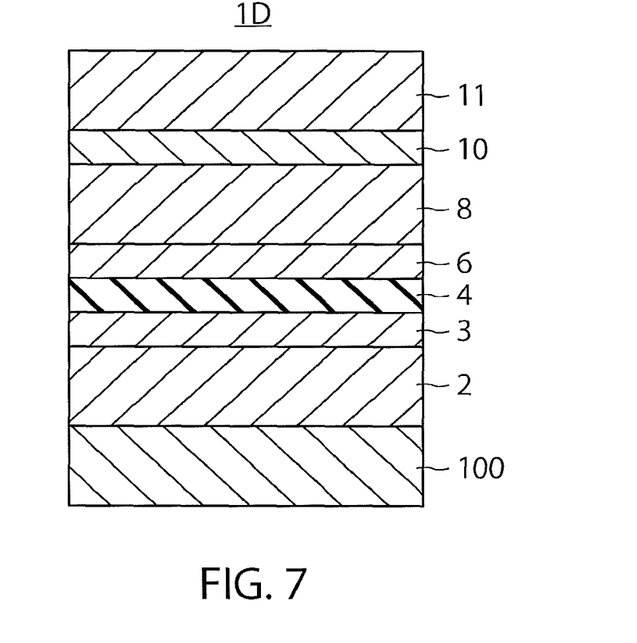
FIG. 7 is a cross-sectional view of a magnetoresistive element according to a third embodiment.

FIG. 7 shows a magnetoresistive element 1D according to a third embodiment. This magnetoresistive element 1D has the same structure as the magnetoresistive element 1B of the second embodiment shown in FIG. 5, except that a nonmagnetic layer 10 and a magnetic layer 11 are stacked on the magnetic layer 8. In this embodiment, the interfacial magnetic layer 6 and the magnetic layer 8 serve as the reference layer. The magnetic layer 11 is also called a bias layer or a shift adjustment layer, and has a magnetization direction antiparallel to (the opposite from) the magnetization of the magnetic layer 8. The magnetic layer 11 may be antiferromagnetically coupled to the magnetic layer 8 via the nonmagnetic layer 10 (synthetic antiferromagnetic coupling (SAF coupling)). With this, it is possible to reduce and adjust shifting of the current that reverses the magnetization of the storage layer formed with the interfacial magnetic layer 3 and the magnetic layer 2. The shifting is caused by magnetic field leakage from the reference layer formed with the interfacial magnetic layer 6 and the magnetic layer 8. The nonmagnetic layer 10 preferably has a heat resistance so that the magnetic layer 8 and the magnetic layer 11 will not mix with each other during a heating process, and also has a function to control the crystalline orientation at the time of the formation of the magnetic layer 11.

If the thickness of the nonmagnetic layer 10 increases, the distance between the magnetic layer 11 and the storage layer (the magnetic layer 2 in this embodiment, for example) becomes longer. As a result, the shift adjusting field to be applied from the magnetic layer 11 to the storage layer becomes smaller. Therefore, the thickness of the nonmagnetic layer 10 is preferably not greater than 5 nm. Also, the magnetic layer 11 may be SAF-coupled to the magnetic layer 8 via the nonmagnetic layer 10 as described above. In that case, if the thickness of the nonmagnetic layer 10 is too great, the magnetic coupling might be broken. In view of this, the thickness of the nonmagnetic layer 10 is preferably not greater than 5 nm. The magnetic layer 11 is formed with a ferromagnetic material having an axis of easy magnetization in a direction perpendicular to the film surfaces. Since the magnetic layer 11 is located further away from the storage layer than the reference layer is, the thickness of the magnetic layer or the size of the saturation magnetization Ms of the magnetic layer 11 needs to be made greater than that of the reference layer so that the leakage magnetic field to be applied to the storage layer is adjusted by the magnetic layer 11.

According to a result of a study made by the inventors, the relational expression shown below needs to be satisfied, where $t_2$ and $Ms_2$ represent the thickness and the saturation magnetization of the reference layer, respectively, and $t_3$ and $Ms_3$ represent the thickness and the saturation magnetization of the magnetic layer 11, respectively.

$$Ms_2 \times t_2 < Ms_3 \times t_3$$

The magnetic layer 11 described in the third embodiment can also be used in a magnetoresistive element of any of the first and second embodiments and the modifications thereof. In this case, the nonmagnetic layer 10 is stacked between the magnetic layers serving as the reference layer.

(Modification)

The third embodiment is a top-biased structure in which the magnetic layer 2, the interfacial magnetic layer 3, the nonmagnetic layer 4, the interfacial magnetic layer 6, the magnetic layer 8, the nonmagnetic layer 10, and the magnetic layer 11 are stacked in this order on the base layer 100. However, the magnetic layer 11 may be stacked under the base layer 100. That is, as in a magnetoresistive element 1E according to a modification of the third embodiment shown in FIG. 8, a bottom-biased structure may be formed by stacking the base layer 100, the magnetic layer 2, an intermediate layer 5, the interfacial magnetic layer 3, the nonmagnetic layer 4, the interfacial magnetic layer 6, and the magnetic layer 8 in this order on the magnetic layer 11. In this case, it is preferable to use the magnetic layer 2 as the reference layer.

Figure 8:
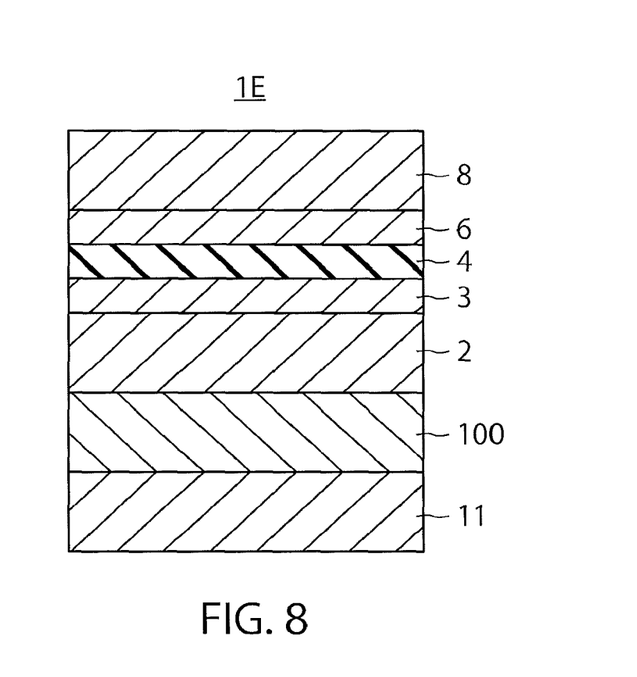
FIG. 8 is a cross-sectional view of a magnetoresistive element according to a modification of the third embodiment.

In the above modification, the amount of leakage magnetic field to be applied to the storage layer from the magnetic layer 11 and the amount of leakage magnetic field generated by the reference layer need to be set at substantially the same value, as described above in the third embodiment. Specifically, in a case where the distance between the storage layer and the shift adjustment layer is shorter than the distance between the storage layer and the reference layer, it is necessary to satisfy the relationship expression: the total amount of magnetization of the shift adjustment layer<the total amount of magnetization of the reference layer. In a case where the distance between the storage layer and the shift adjustment layer is longer than the distance between the storage layer and the reference layer, on the other hand, it is necessary to satisfy the relationship expression: the total amount of magnetization of the shift adjustment layer>the total amount of magnetization of the reference layer.

According to the third embodiment and the modification thereof, the influence of diffusion of the elements contained in the base layer can be reduced even if the storage layer is made thinner, as in the second embodiment.

(Fourth Embodiment)

Referring now to FIGS. 9A through 10C, a method of manufacturing a magnetoresistive element according to one of the first through third embodiments and the modifications thereof is described.

By this manufacturing method, a substrate such as a single-crystal substrate on which a magnetoresistive element is to be formed, and a substrate having a transistor formed thereon are prepared. After the magnetoresistive element formed on the single-crystal substrate and the substrate having a transistor and the like formed thereon are bonded to each other, the unnecessary single-crystal substrate is removed. Thus, a MRAM including the magnetoresistive element 1B is formed.

Figure 9A:
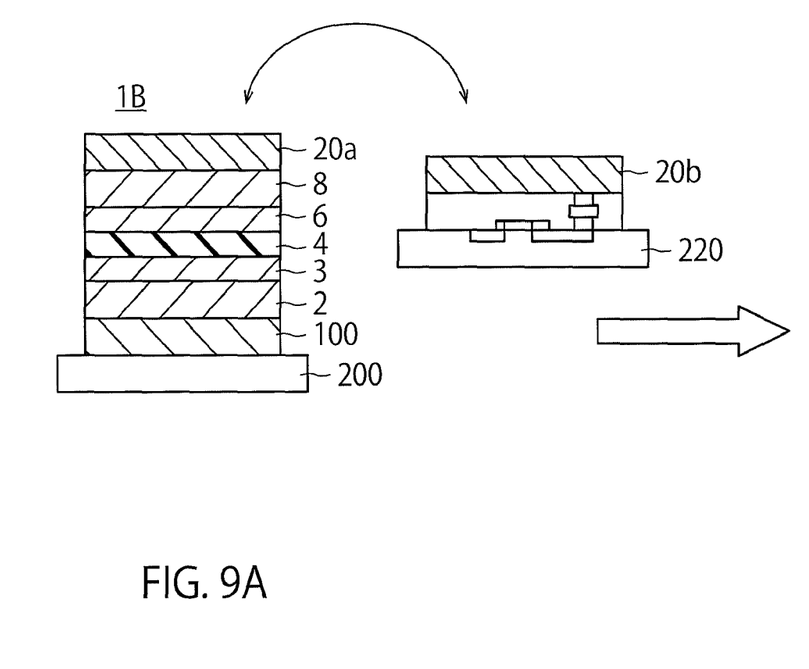
FIGS. 9A through 9B are diagrams showing a magnetoresistive element manufacturing method according to a fourth embodiment.

Specifically, a magnetoresistive element of one of the first through third embodiments and the modifications thereof is first formed on a substrate 200 under appropriate film forming conditions. An example case where the magnetoresistive element 1B of the second embodiment shown in FIG. 5 is manufactured is described below. First, as shown in FIG. 9A, the base layer 100, the magnetic layer 2, the interfacial magnetic layer 3, the nonmagnetic layer 4, the interfacial magnetic layer 6, and the magnetic layer 8 are formed in this order on a Si single-crystal substrate 200 by a sputtering technique or MBE (Molecular Beam Epitaxy), so that the magnetoresistive element 1B shown in FIG. 5 is formed. At this stage, the crystal characteristics of the Si single-crystal substrate 200 propagate to the base layer 100 and the magnetic layer 2, and the formed magnetoresistive element 1B becomes a single-crystal MTJ element including at least one single-crystal layer. After that, a metal bonding layer 20a is formed on the magnetic layer 8 (FIG. 9A). Likewise, a substrate 220 having a transistor circuit and wiring lines formed thereon is prepared, and a metal bonding layer 20b is formed on the substrate 220 (FIG. 9A). The metal bonding layers 20a and 20b may be metal layers formed with Al, Au, Cu, Ti, Ta, or the like.

Figure 9B:
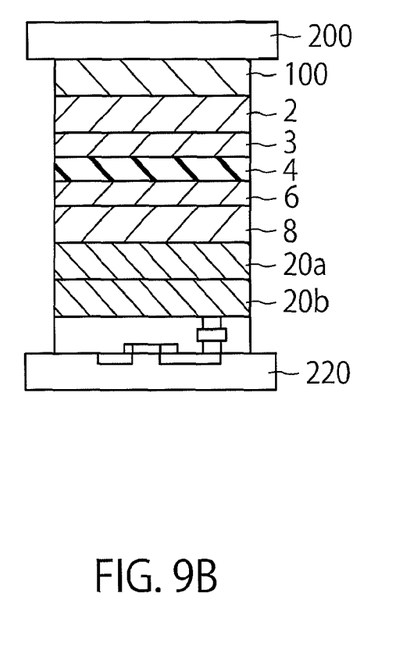

The substrate 200 having the single-crystal MTJ element 1B formed thereon, and the substrate 220 having the transistor circuit formed thereon are arranged so that the metal bonding layers 20a and 20b face each other. After that, the metal bonding layers 20a and 20b are brought into contact with each other, as shown in FIG. 9B. At this stage, pressure is applied to the metal bonding layers 20a and 20b, so that the metal bonding layers 20a and 20b are bonded to each other. To increase the adhesive force, heat may also be applied to the metal bonding layers 20a and 20b when the pressure is applied thereto.

Figure 10A:
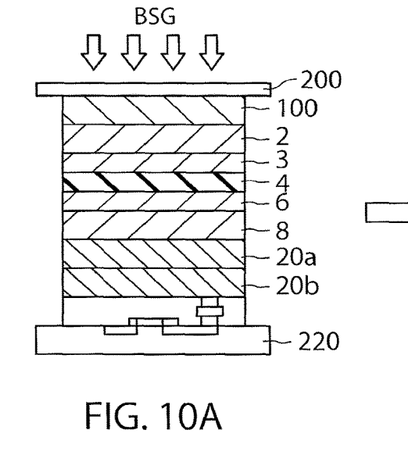
FIGS. 10A through 10C are diagrams showing the magnetoresistive element manufacturing method according to the fourth embodiment.
Figure 10B:
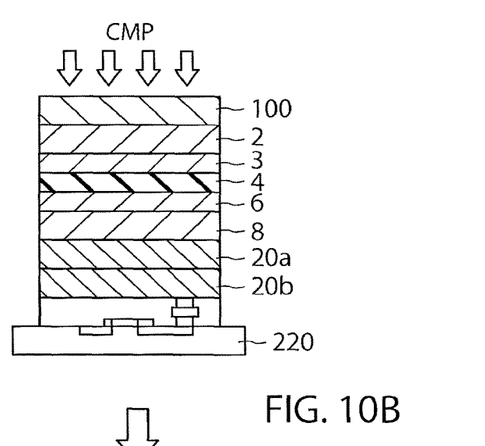
Figure 10C:
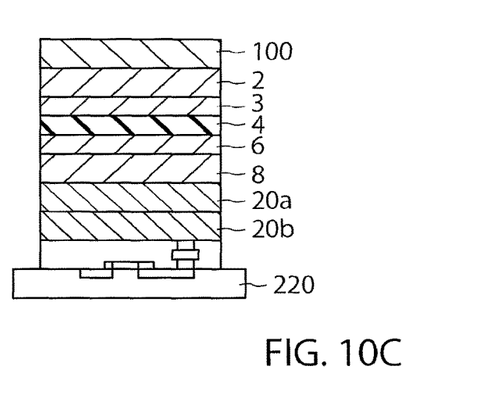

Next, the single-crystal substrate 200 having the single-crystal MTJ element 1B formed thereon is removed as shown in FIG. 10A. The single-crystal substrate 200 is first thinned by BSG (Back Side Grinder), for example. After that, the thinned single-crystal substrate 200 is mechanically polished by CMP (Chemical Mechanical Polishing) or the like, and is then removed, as shown in FIG. 10B. Thus, the MTJ element 1B is completed (FIG. 10C).

As described above, a single-crystal MTJ element of one of the first through third embodiments and the modifications thereof formed on the single-crystal substrate 200, and the substrate 220 having a transistor circuit formed thereon are prepared, and the substrate 220 having the transistor and the like formed thereon is bonded to the single-crystal MTJ element. After that, the unnecessary single-crystal substrate 200 is removed. By this manufacturing method involving the above series of processes, a single-crystal MTJ element of one of the first through third embodiments and the modifications thereof can be manufactured.

In a case where the magnetic layer 2 serves as the storage layer, a magnetoresistive element manufactured by the above manufacturing method has a top-free structure in which the magnetic layer 2 is located above the magnetic layer 8 serving as the reference layer. A method of manufacturing a magnetoresistive element that has a bottom-free structure in which the storage layer is located below the reference layer is briefly described below.

First, as shown in the right side in FIG. 9A, the substrate 220 having a transistor circuit and wiring lines formed thereon is prepared, for example. At this stage, the metal bonding layer 20b has not been formed yet on the transistor circuit and the wiring lines. The base layer 100 is then formed on the substrate 220. The magnetic layer 2, the interfacial magnetic layer 3, the nonmagnetic layer 4, the interfacial magnetic layer 6, and the magnetic layer 8 are then formed in this order on the base layer 100 by a sputtering technique or MBE (Molecular Beam Epitaxy). In this manner, a magnetoresistive element having a bottom-free structure can be manufactured.

(Fifth Embodiment)

Next, a magnetic memory (MRAM) of a spin-injection write type according to a fifth embodiment is described.

Figure 11:
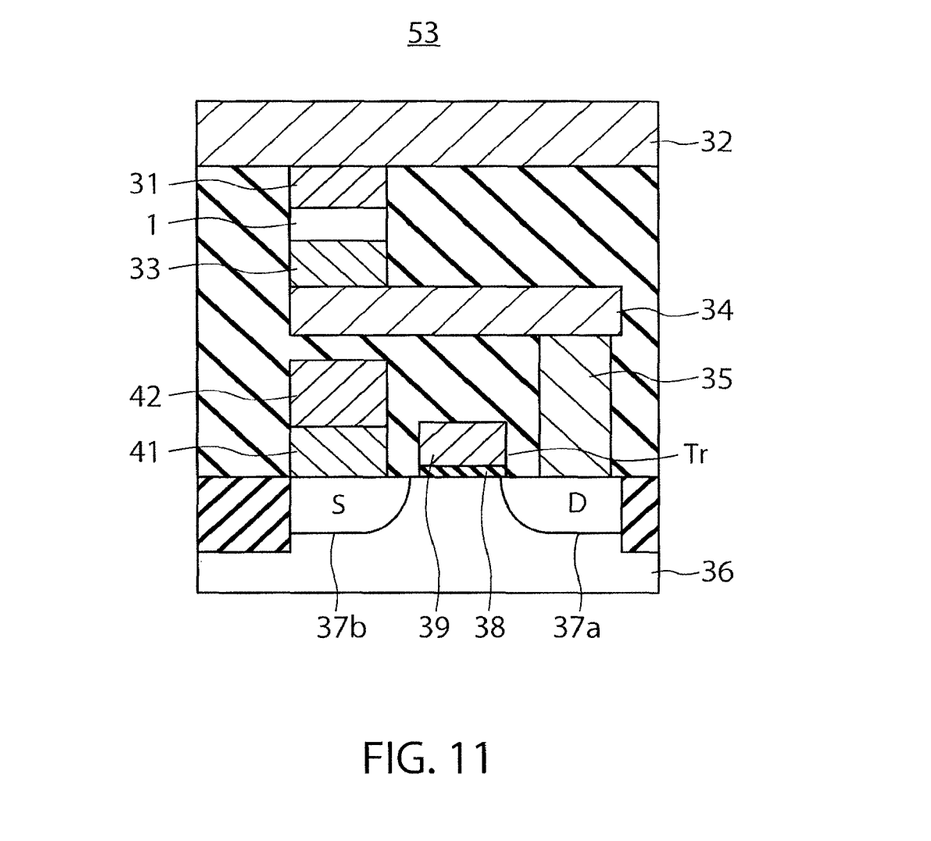
FIG. 11 is a cross-sectional view of a memory cell in a magnetic memory according to a fifth embodiment.

The MRAM of the fifth embodiment includes memory cells. FIG. 11 shows a cross-section of the relevant components of a memory cell in the MRAM of this embodiment. Each memory cell includes one of the magnetoresistive elements of the first through third embodiments and the modifications thereof as a storage element. In the fifth embodiment, an example case where the storage element is the magnetoresistive element (MTJ element) 1 of the first embodiment is described.

As shown in FIG. 11, the upper surface of the MTJ element 1 is connected to a bit line 32 via an upper electrode 31. The lower surface of the MTJ element 1 is connected to a drain region 37a of source/drain regions (first and second terminals) in a surface of a semiconductor substrate 36, via a lower electrode 33, an extraction electrode 34, and a plug 35. The drain region 37a, a source region 37b, a gate insulating film 38 formed on the substrate 36, and a gate electrode (a control terminal) 39 formed on the gate insulating film 38 constitute a select transistor Tr. The select transistor Tr and the MTJ element 1 constitute one memory cell in the MRAM. The source region 37b is connected to another bit line 42 via a plug 41. Alternatively, the extraction electrode 34 may not be used, the plug 35 is provided under the lower electrode 33, and the lower electrode 33 and the plug 35 may be connected directly to each other. The bit lines 32 and 42, the electrodes 31 and 33, the extraction electrode 34, and the plugs 35 and 41 may be formed with W, Al, AlCu, Cu, or the like.

Figure 12:
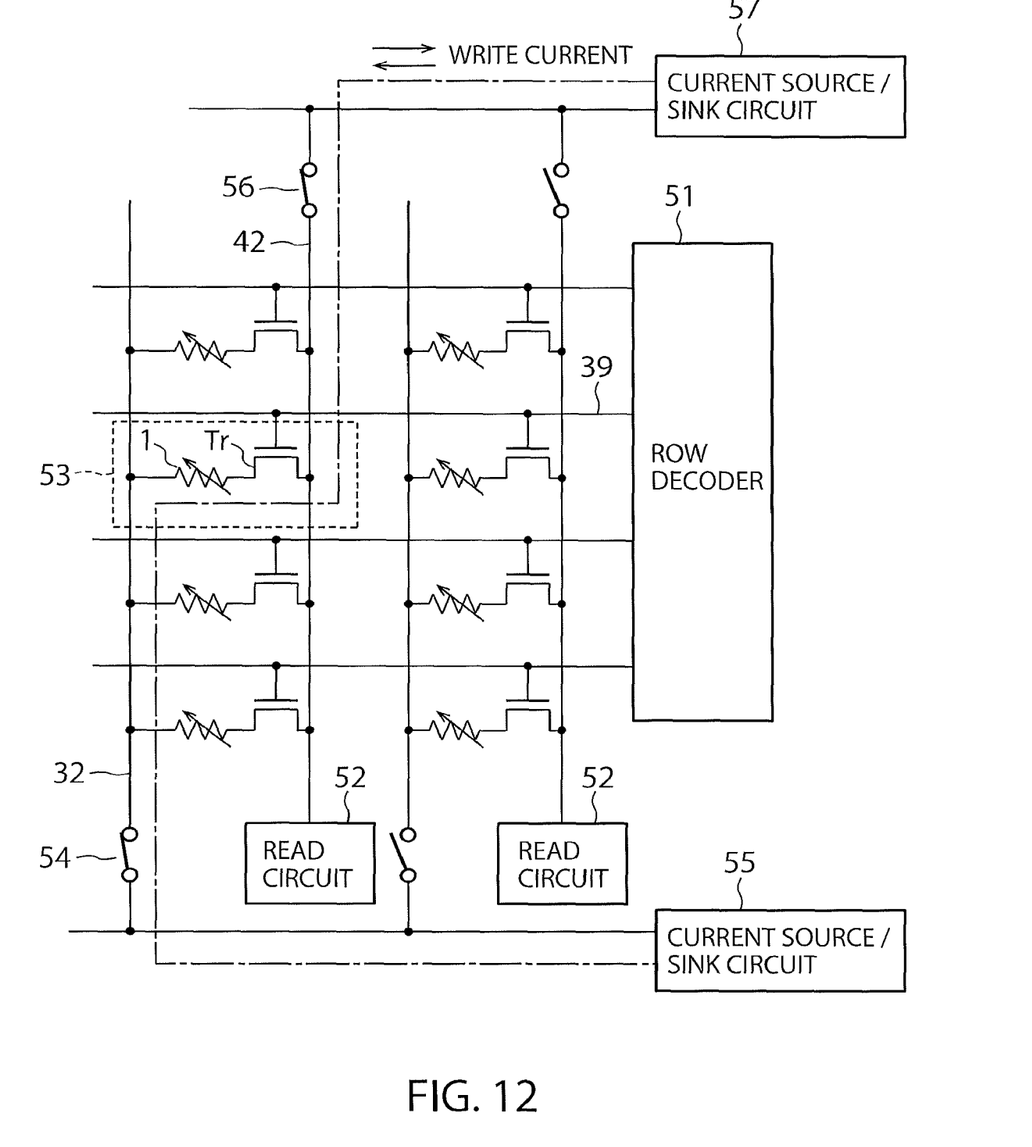
FIG. 12 is a circuit diagram showing the relevant components of the magnetic memory according to the fifth embodiment.

In the MRAM of this embodiment, the memory cells, one of which is shown in FIG. 11, are arranged in a matrix, to form the memory cell array of the MRAM. FIG. 12 is a circuit diagram showing the relevant components of the MRAM of this embodiment.

As shown in FIG. 12, memory cells 53 each including the MTJ element 1 and the select transistor Tr are arranged in a matrix. One terminal of each of the memory cells 53 belonging to the same column is connected to the same bit line 32, and the other terminal is connected to the same bit line 42. The gate electrodes of the select transistors Tr of the memory cells 53 belonging to the same row are connected to one another by a word line 39, and are further connected to a row decoder 51.

The bit lines 32 are connected to a current source/sink circuit 55 via a switch circuit 54 of a transistor or the like. Also, the bit lines 42 are connected to a current source/sink circuit 57 via a switch circuit 56 of a transistor or the like. The current source/sink circuits 55 and 57 supply a write current to the bit lines 32 and 42 connected thereto, or pull out the write current from the bit lines 32 and 42 connected thereto.

The bit lines 42 are also connected to read circuits 52. Alternatively, the read circuits 52 may be connected to the bit lines 32. The read circuits 52 each include a read current circuit and a sense amplifier.

At a time of writing, the switch circuits 54 and 56 connected to the write target memory cell, and the select transistor Tr are switched on, to form a current path via the target memory cell. In accordance with the information to be written, one of the current source/sink circuits 55 and 57 functions as the current source, and the other one of the current source/sink circuits 55 and 57 functions as the current sink. As a result, the write current flows in the direction corresponding to the information to be written.

As for the write speed, spin-injection writing can be performed with a current having a pulse width from several nanoseconds to several microseconds.

At a time of reading, a read current that is so small as not to cause magnetization switching with the above mentioned read current circuit is supplied to the MTJ element 1 designated in the same manner as in writing. The sense amplifier of the read circuit 52 then determines the resistance state of the MTJ element 1 by comparing the current value or the voltage value derived from the resistance value corresponding to the magnetization state of the MTJ element 1 with a reference value.

At a time of reading, the current pulse width is preferably smaller than that at a time of writing. With this, wrong writing with the read current can be reduced. This is based on the fact that a write current with a small pulse width leads to a write current value with a large absolute value.

As described above, according to this embodiment, the influence of diffusion of the elements contained in the base layer can be reduced even if the storage layer is made thinner, as in the first through third embodiments and the modifications thereof. Also, it is possible to obtain a magnetic memory including a magnetoresistive element that has low saturation magnetization, a high perpendicular magnetic anisotropy, and a high magnetoresistance ratio.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element, comprising:
   a first layer having a CsCl structure and containing $Co_xAl_{100-x}$ where 46 atomic % $\leq x <$ 56 atomic %;
   a first magnetic layer;
   a first nonmagnetic layer between the first layer and the first magnetic layer; and
   a second magnetic layer, which is disposed between the first layer and the first nonmagnetic layer and contains Mn and Ga.

2. The magnetoresistive element according to claim 1, wherein the first layer has a surface oriented in a (001) plane and facing the second magnetic layer.

3. The magnetoresistive element according to claim 1, wherein the second magnetic layer has a magnetization direction that is changeable by a current flowing between the first magnetic layer and the second magnetic layer.

4. The magnetoresistive element according to claim 1, further comprising:
   a third magnetic layer disposed in a portion between the first magnetic layer and the first nonmagnetic layer or a portion between the second magnetic layer and the first nonmagnetic layer.

5. The magnetoresistive element according to claim 4, wherein the third magnetic layer contains at least one element of Co and Fe.

6. The magnetoresistive element according to claim 1, further comprising:
   a fourth magnetic layer; and
   a second nonmagnetic layer,
   wherein the first magnetic layer is disposed between the fourth magnetic layer and the first nonmagnetic layer, and the second nonmagnetic layer is disposed between the first magnetic layer and the fourth magnetic layer.

7. The magnetoresistive element according to claim 6, satisfying the following relationship:

$$Ms_1 \times t_1 < Ms_4 \times t_4,$$

where $t_1$ and $Ms_1$ represent thickness and saturation magnetization of the first magnetic layer, respectively, and $t_4$ and $Ms_4$ represent thickness and saturation magnetization of the fourth magnetic layer, respectively.

8. The magnetoresistive element according to claim 1, wherein the first magnetic layer includes at least one of:
   a second layer containing at least one element of Fe, Co, and Ni, and at least one element of Tb, Dy, and Gd;
   a third layer containing at least one element of Fe, Co, Ni, and Cu, and at least one element of Pt, Pd, Rh, and Au; and
   a stack structure including a fourth layer and a fifth layer, the fourth layer including at least one element of Fe, Co, and Ni, and the fifth layer including at least one element of Cr, Pt, Pd, Ir, Rh, Ru, Os, Re, Au, and Cu.

9. A magnetic memory, comprising:
   the magnetoresistive element according to claim 1;
   a first wiring electrically connected to the first magnetic layer of the magnetoresistive element; and
   a second wiring electrically connected to the second magnetic layer of the magnetoresistive element.

10. The memory according to claim 9, wherein the first layer of the magnetoresistive element has a surface oriented in a (001) plane and facing the second magnetic layer.

11. The memory according to claim 9, wherein the second magnetic layer has a magnetization direction that is changeable by a current flowing between the first magnetic layer and the second magnetic layer.

12. The memory according to claim 9, further comprising:
    a third magnetic layer disposed in a portion between the first magnetic layer and the first nonmagnetic layer or a portion between the second magnetic layer and the first nonmagnetic layer.

13. The memory according to claim 12, wherein the third magnetic layer contains at least one element of Co and Fe.

14. The memory according to claim 9, further comprising:
    a fourth magnetic layer; and
    a second nonmagnetic layer,
    wherein the first magnetic layer is disposed between the fourth magnetic layer and the first nonmagnetic layer, and the second nonmagnetic layer is disposed between the first magnetic layer and the fourth magnetic layer.

15. The memory according to claim 14, satisfying the following relationship:

$$Ms_1 \times t_1 < Ms_4 \times t_4,$$

where $t_1$ and $Ms_1$ represent thickness and saturation magnetization of the first magnetic layer, respectively, and $t_4$ and $Ms_4$ represent thickness and saturation magnetization of the fourth magnetic layer, respectively.

16. The memory according to claim 9, wherein the first magnetic layer includes at least one of:
    a second layer containing at least one element of Fe, Co, and Ni, and at least one element of Tb, Dy, and Gd;
    a third layer containing at least one element of Fe, Co, Ni, and Cu, and at least one element of Pt, Pd, Rh, and Au; and
    a stack structure including a fourth layer and a fifth layer, the fourth layer including at least one element of Fe, Co, and Ni, and the fifth layer including at least one element of Cr, Pt, Pd, Ir, Rh, Ru, Os, Re, Au, and Cu.

* * * * *